(12) United States Patent
Martin et al.

(10) Patent No.: US 7,401,385 B2
(45) Date of Patent: Jul. 22, 2008

(54) MOLDED INSTRUMENT HANDLE AND METHOD OF MANUFACTURING

(75) Inventors: Jim L. Martin, Tigard, OR (US); Jerry L. Wrisley, Beaverton, OR (US); Michael Lazarev, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 236 days.

(21) Appl. No.: 11/034,315

(22) Filed: Jan. 11, 2005

(65) Prior Publication Data
US 2006/0150371 A1  Jul. 13, 2006

(51) Int. Cl.
*A45C 3/00* (2006.01)
(52) U.S. Cl. .......................... 16/444; 16/114.1; 16/411; 16/421
(58) Field of Classification Search ................ 16/114.1, 16/412, 411, 444, 435, 436, 421, 422, 110 R, 16/111 R, 902, DIG. 12, DIG. 18, DIG. 24
See application file for complete search history.

(56) References Cited

U.S. PATENT DOCUMENTS

| | | | | |
|---|---|---|---|---|
| 2,146,415 A | * | 2/1939 | Bradley | 220/753 |
| 3,393,423 A | * | 7/1968 | Adams | 16/444 |
| 3,766,598 A | * | 10/1973 | Roberts | 16/444 |
| 3,813,729 A | * | 6/1974 | Szabo et al. | 16/408 |
| 4,280,247 A | * | 7/1981 | Burzen et al. | 16/409 |
| 5,144,718 A | * | 9/1992 | Ozawa | 16/412 |
| 5,303,451 A | * | 4/1994 | Graviss et al. | 16/412 |
| 5,579,556 A | * | 12/1996 | Chung | 16/110.1 |
| 5,740,587 A | * | 4/1998 | Onai et al. | 16/412 |
| 5,771,536 A | * | 6/1998 | Sieg et al. | 16/431 |
| 6,119,309 A | * | 9/2000 | Lu | 16/114.1 |
| 6,167,592 B1 | * | 1/2001 | Tsai | 16/411 |

FOREIGN PATENT DOCUMENTS

| | | | |
|---|---|---|---|
| DE | 3248509 A1 | * | 8/1984 |
| EP | 279973 A1 | * | 8/1988 |

* cited by examiner

*Primary Examiner*—William L. Miller
(74) *Attorney, Agent, or Firm*—Bennet K. Langlotz; Thomas F. Lenihan

(57) ABSTRACT

A handle for an electronic instrument housing includes an elongated grip portion. The grip portion includes two elongated elements each having opposed ends. The elements are connected to each other to form an elongated chamber. An elastomeric layer encompasses an intermediate portion of the grip portion, and the grip portion has a vent aperture communicating with the chamber. The vent aperture may be beyond the elastomeric layer, at one or both ends. One of the elongated elements may form a channel with tapered edge surfaces receiving the other element, so that pressure of elastomeric molding tends to wedge the parts together to form a seal against incursion of the elastomer.

6 Claims, 4 Drawing Sheets

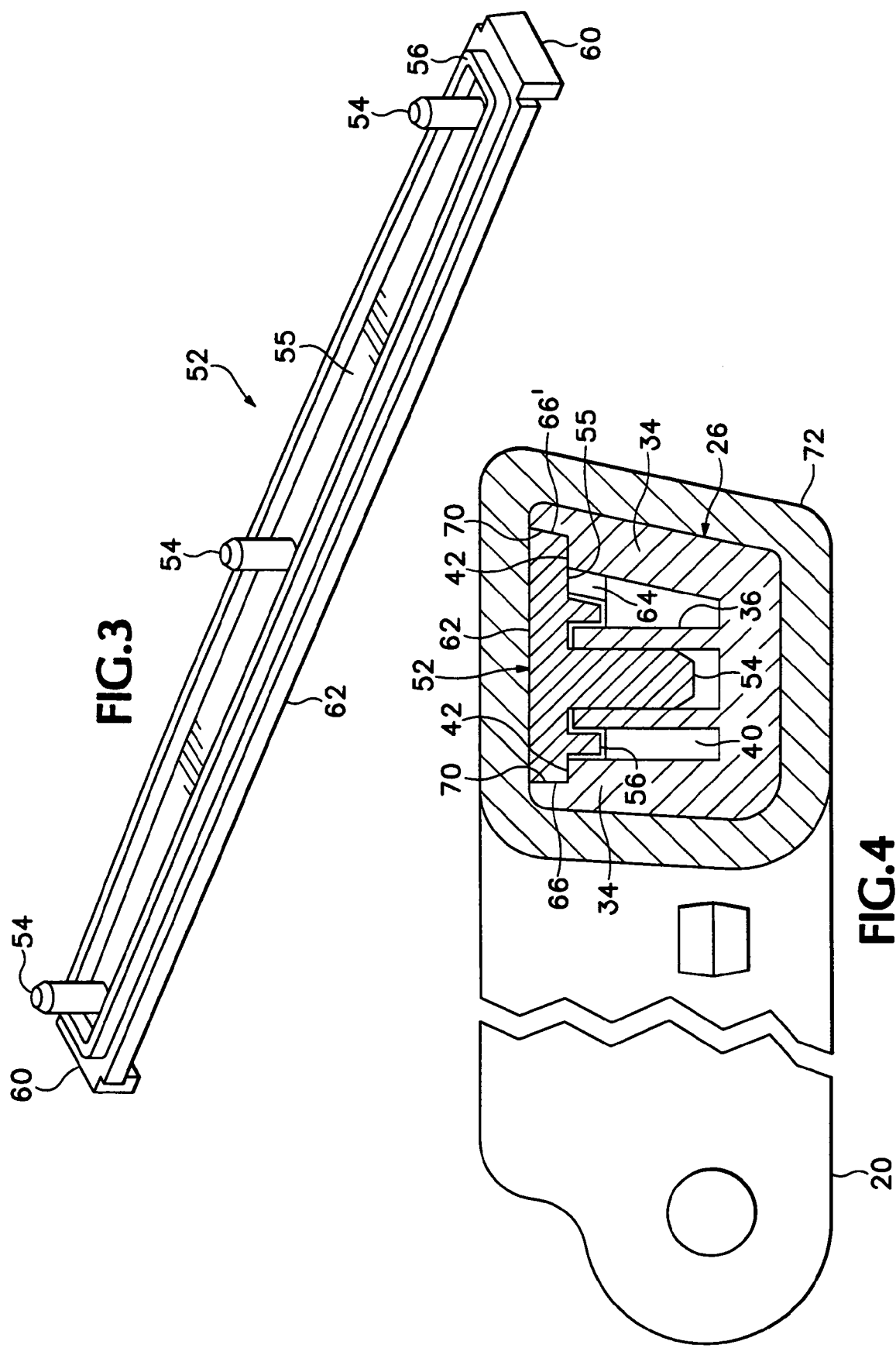

MOLDED INSTRUMENT HANDLE AND METHOD OF MANUFACTURING

FIELD OF THE INVENTION

This invention relates to plastics molding, and to hollow molded forms with elastomeric overmolding.

BACKGROUND OF THE INVENTION

Carry handles for electronic instruments are normally desired to be lightweight, relatively rigid, and comfortable. A typical handle has an elongated grip with a hollow tube providing structural support, and an overmolded elastomeric coating for user comfort. The cores of such hollow handles may be formed by gas assist molding, in which air is introduced into the plastic molding process to provide a hollow chamber. While effective, gas assist molding has the disadvantage of being relatively expensive compared to conventional injection molding. In addition, the process is too sophisticated for many manufacturers, limiting the available sources for such parts.

An alternative to gas assist molding for forming hollow parts is to form such parts in two pieces, and assemble them to provide a hollow part. This is feasible in some applications. However, multi-part construction is normally not suitable for parts that require overmolding with an elastomeric layer. The overmolding process involves placing the molded handle into a larger mold, and injecting elastomer into the void between the handle and the mold to provide a conforming elastomer layer. The pressures involved in the overmolding process may crush the core part if it lacks sufficient structural integrity, and any gaps between the components can allow an unwanted incursion of elastomer into the hollow chamber. Moreover, even if the core is adequately sealed against incursion of elastomer, even minimal gaps or seams allow pressurized gas to get trapped inside the part during overmolding process. This pressurized gas then can cause bubbling or delamination of the overmolded material when the part is released from the pressure of the mold, as the gas attempts to expand.

SUMMARY OF THE INVENTION

A handle for an electronic instrument housing includes an elongated grip portion. The grip portion includes two elongated elements each having opposed ends. The elements are connected to each other to form an elongated chamber. An elastomeric layer encompasses an intermediate portion of the grip portion, and the grip portion has a vent aperture communicating with the chamber. The vent aperture may be beyond the elastomeric layer, at one or both ends. One of the elongated elements may form a channel with tapered edge surfaces receiving the other element, so that pressure of elastomeric molding tends to wedge the parts together to form a seal against incursion of the elastomer.

BRIEF DESCRIPTION OF THE DRAWINGS

FIG. 3 is a perspective view of a cover component of the handle of FIG. 1.

FIG. 4 is an enlarged sectional view taken along line 4-4 of FIG. 2.

DETAILED DESCRIPTION OF A PREFERRED EMBODIMENT

Figure 1:
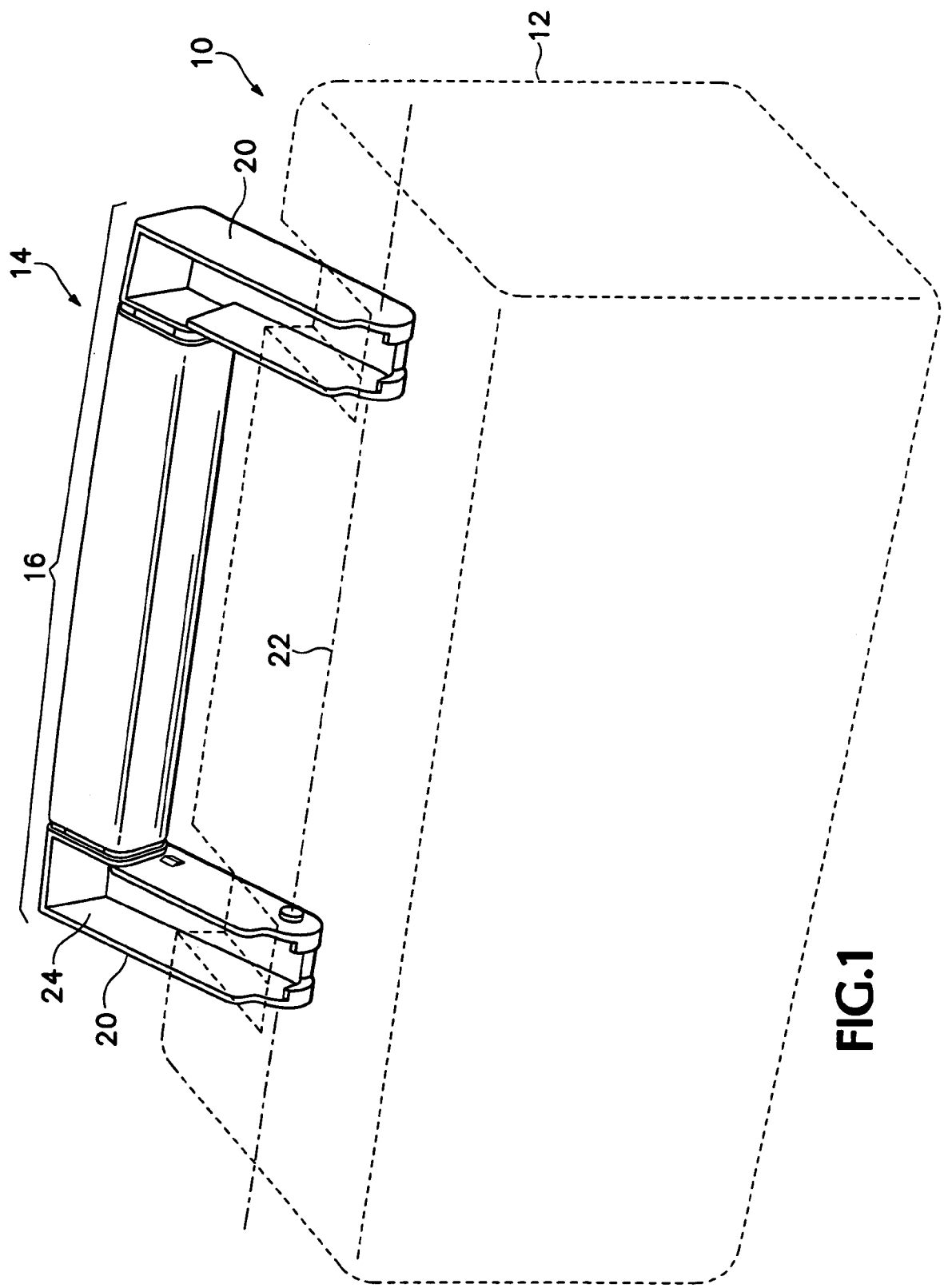
FIG. 1 is a perspective view of an instrument with a handle according to a preferred embodiment of the invention.

FIG. 1 shows an electronic instrument 10 with a housing 12 enclosing electronic components and circuitry. A handle 14 is pivotally connected to the housing. The handle has an elongated straight grip portion 16, with a pair of legs 20 extending perpendicularly from the respective ends of the grip portion. The free ends of the legs are removably and pivotally connected to the housing for pivoting the handle about an axis 22 that is parallel to the grip portion, so that the handle can be laid flat against the housing for storage and use, and pivoted away from the housing to a vertical position for carrying. In FIG. 1 the visible major face 24 of the handle faces up when the handle is in the horizontal storage position, and faces forward when the handle is in the vertical carrying position.

Figure 2:
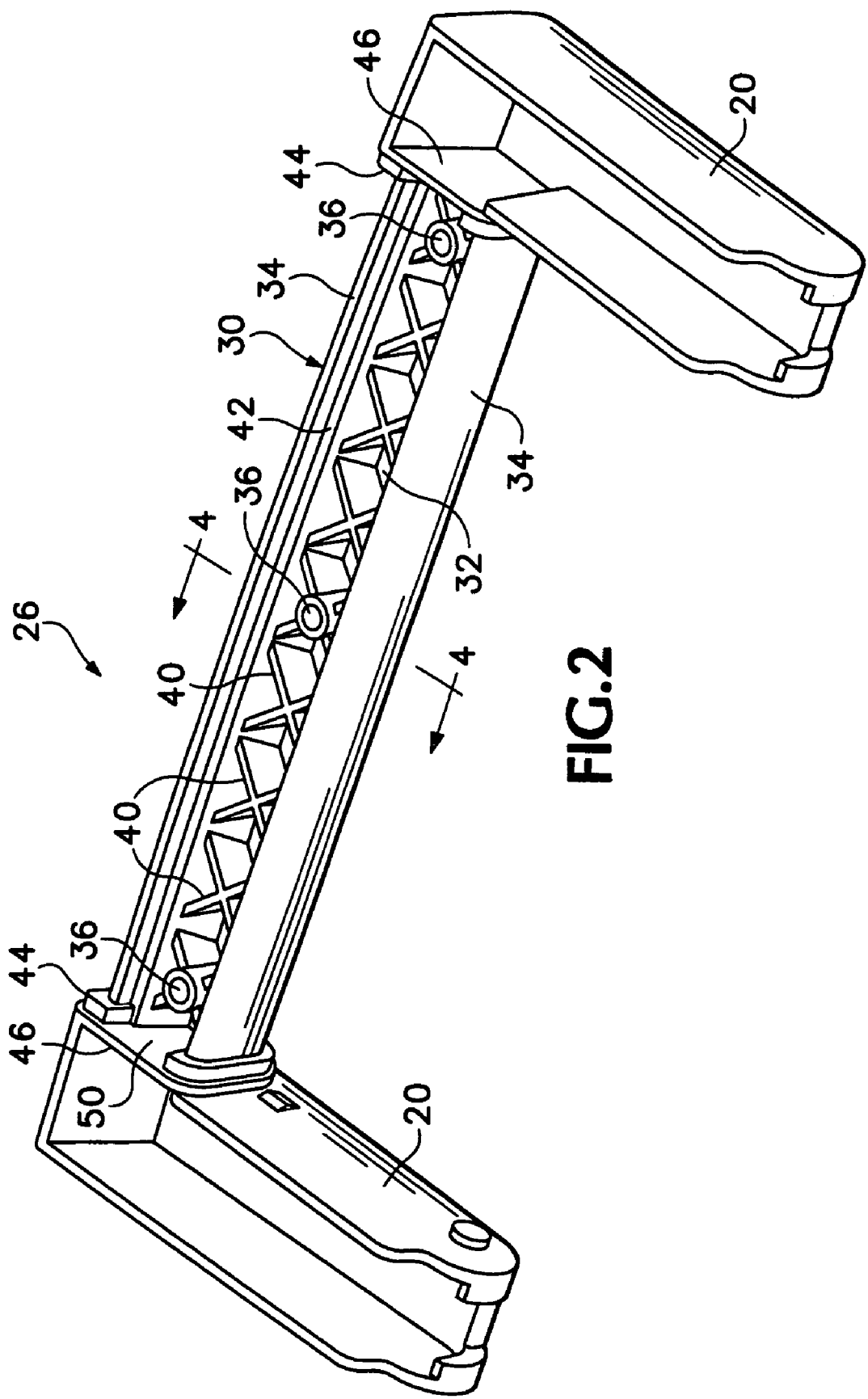
FIG. 2 is a perspective view of a core component of the handle of FIG. 1.

FIG. 2 shows the handle core 26, which is the major structural component of the handle. The core is formed of a substantially rigid thermoplastic such as Polycarbonate/ABS blend, and includes the entirety of the legs 20, as well as the structural portion of the grip. The illustration shows the rear side of the core, which is generally hollow and concave to the rear (the upward direction in the illustration) to provide light weight and a consistent wall thickness. The grip portion of the core is provided by a channel portion 30 that has a generally U-shaped cross section, with a base panel or floor 32, and upstanding side walls 34 extending the length of the grip. A set of hollow cylindrical bosses 36 protrude upward from the base panel to a level below the upper edges of the side walls. An array of X-shaped stiffening webs 40 spans between the side walls and is connected to the floor to provide rigidity, torsional stiffness and support for cover during overmolding of elastomer. The upper edges of the side walls (which actually face the rear of the handle when in use) include a step 42 that steps down toward the interior channel. The step surface (shown in detail in FIG. 4) is at a level below the upper edges of the side walls, aligned with the upper faces of the bosses 36. The upper edges of the stiffening webs is below the level of the steps to permit gas flow along the length of the channel, with the levels being described in the context of the orientation of the illustration.

The ends of the channel portion 30 are terminated with a surrounding flange 44 that surrounds the side wall ends and the floor, but not the open upper channel. The legs 20 include an end panel 46 having a flat inner face which encloses each end of the channel just beyond the flanges 44. The flanges and the flat inner face of each end panel cooperate to define a central elongated recess 50 extending from the upper edge of the inner face to a distance well down toward the bottom of the channel to provide a vent aperture as will be discussed below. In alternative embodiments, a recess may be provided only at a single end, but the preferred embodiment employs two for symmetry and protective redundancy.

FIG. 3 shows a lid or cover element 52 that is an elongated panel of the same material as the handle core. A set of three pins 54 protrude from a first face 55 of the panel with spacing and dimensions to tightly engage the bores of the bosses 36 of the core. A ridge 56 is located on the first face of the panel and extends a limited distance above the first face, forming a oblong ring about the pins, and spaced back slightly from each edge of the panel. An integral end element 60 is connected at each end. Each end element has a width slightly less than the width of the panel, is flush with the panel's first surface 55, and protrudes beyond the opposed flat second surface 62 by the same amount by which the flange 44 of the core protrudes beyond the grip surfaces.

FIG. 4 shows the lid 52 assembled to the core 26. The first surface 55 of the lid rests or nearly on the steps 42, and the second surface 62 is flush with the exterior of the core. The pins 54 are tightly received within the boss 36, and may be secured by a tight press fit, adhesive, and/or ultrasonic welding. The ridge 56 of the lid is spaced apart from the interior walls of the core, from the upper edges of the stiffeners 40, and from the bosses, to provide for free gas flow the length of the chamber 64 enclosed by the core and lid. The major elongated side edges 66, 66' of the lid panel are not parallel to each other, but are tapered to provide a wedge that inserts into a similar tapered space between the uppermost portions 70 of the core side walls above the step surfaces 42. In the illustrated embodiment, the edges 66' at the right and left side of the figure are tapered to provide tight seal between walls.

Figure 5:
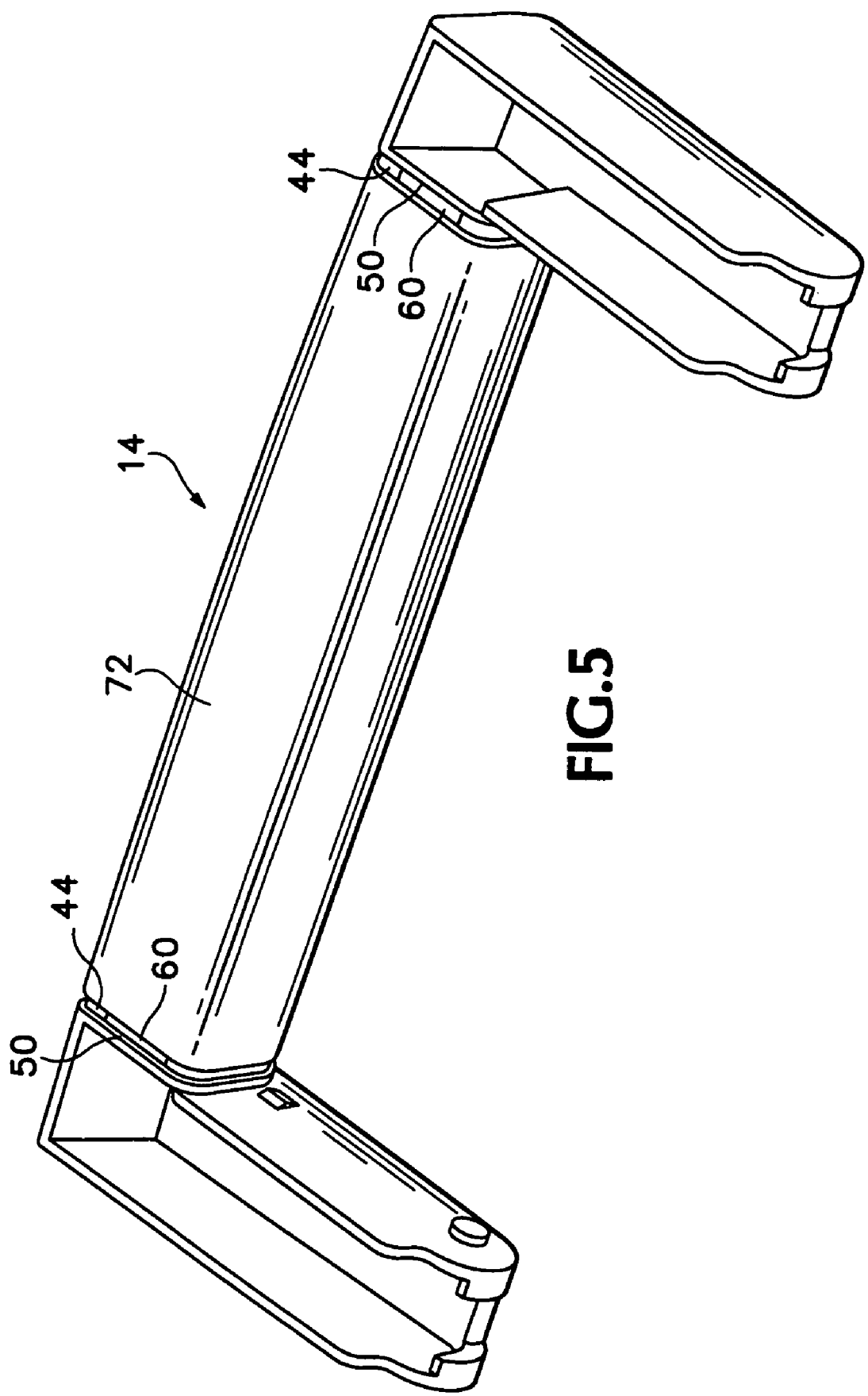
FIG. 5 is a perspective view of a handle according to the preferred embodiment.

An elastomeric coating layer 72 covers most of the length of the channel portion 30 and lid 52. The coating closely and conformally encompasses the intermediate portion of the handle as shown, with the exterior shape defined by the mold into which the core is placed and the elastomer injected. As shown in FIG. 5, the completed handle has the elastomeric grip coating 72 extending from flange 44 to flange 44, with the lid end elements 60 forming part of the flange, and placing a limit on the axial extent of the elastomer. Essentially, the mold for the overmolding process has a seal formed about each flange portion to keep the elastomer between the flanges.

During overmolding of the elastomer over the assembled core and lid, the air trapped in the space between the core and the mold walls (the space that will be filled with elastomer) is displaced by the entering elastomer. Some air may be allowed to vent through vents provided in the mold. However, some air may be forced into the core chamber due to the pressure of injection. Even with the close fit and wedging effect discussed above, some air may penetrate into the chamber, which would leave the chamber at greater than atmospheric pressure. However, the vent apertures 50 allow the injected air to escape from the chamber in real time during injection and subsequently as needed, so that no bubbling or delamination occurs upon overmolding.

In the preferred embodiment, each vent has a cross sectional area of 0.0008 square inches, and the handle grip portion has a length of 4.5 inch and an internal volume of 0.4 cubic inches. While the vent area is relatively small compared to the enclosed chamber volume, it is adequate because it represents a freer path of gas escape compared to the lid seams, which may not be large than 0.0005 inch to make sure that elastomer material can not penetrate inside the chamber Thus, gas prefers to escape via the vents than through the seams, which would lead to trapped bubbles under the overmolded elastomer.

While the above is discussed in terms of preferred and alternative embodiments, the invention is not intended to be so limited.

The invention claimed is:

1. A carrying handle comprising:
a first elongated element having opposed first and second ends, at least one of the first and second ends of the first element including a flange;
a second elongated element connected to the first elongated element, the second elongated element having opposed first and second ends wherein at least one of the first and second ends includes an integral end element for cooperating with the respective flange of the first elongated element;
the first and second elements defining a chamber extending from the first end to the second end of the first element;
a pair of extension elements, each attached to a respective end of the first element, and angularly offset therefrom, such that free ends of the extension elements are operable for connection to an instrument to provide the carrying handle;
at least one of the extension elements including an end panel having a flat inner face connected to the respective flange of the first elongated element, wherein the respective flat inner face, flange and integral end element cooperate to define the aperture at the at least one of the first and second ends of the first elongated element;
an elastomeric layer encompassing an intermediate portion of the first and second elongated elements, said elastomeric layer being applied by an injection molding process; and
said aperture allowing air injected in said molding process to escape from said chamber.

2. The carrying handle of claim 1 wherein the first elongated element defines an elongated channel extending between the first and second ends thereof.

3. The carrying handle of claim 2 wherein the second elongated element includes an elongated flat portion having said integral end element at each of the first and second ends thereof.

4. The carrying handle of claim 1 wherein the elastomeric layer is conformally connected to the first and second elements.

5. The carrying handle of claim 1 wherein the chamber has said aperture at each of the first and second ends of the first elongated element.

6. The carrying handle of claim 1 wherein the second element is received between opposed elongated surfaces of the first element, and wherein the elongated surfaces define a tapered space, such that the second element is wedged between the surfaces in response to pressure developed in said injection molding process.

\* \* \* \* \*